(12) United States Patent
Kim et al.

(10) Patent No.: US 11,570,910 B2
(45) Date of Patent: Jan. 31, 2023

(54) DISPLAY DEVICE

(71) Applicant: Samsung Display Co., LTD., Yongin-si (KR)

(72) Inventors: Min-Sung Kim, Hwaseong-si (KR); Hansun Ryou, Seoul (KR); Sanghyo Park, Suwon-si (KR); Heonjung Shin, Hwaseong-si (KR); Hyoyul Yoon, Seoul (KR); Jae Hoon Jeong, Bucheon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 226 days.

(21) Appl. No.: 17/121,844

(22) Filed: Dec. 15, 2020

(65) Prior Publication Data

US 2021/0378109 A1 Dec. 2, 2021

(30) Foreign Application Priority Data

May 28, 2020 (KR) .................. 10-2020-0064098

(51) Int. Cl.
| | |
|---|---|
| *B32B 3/18* | (2006.01) |
| *H05K 5/00* | (2006.01) |
| *H01L 51/52* | (2006.01) |
| *H05K 5/02* | (2006.01) |
| *H05K 5/03* | (2006.01) |

(Continued)

(52) U.S. Cl.
CPC ............ *H05K 5/0017* (2013.01); *B32B 3/18* (2013.01); *B32B 7/14* (2013.01); *B32B 27/08* (2013.01); *G02F 1/133305* (2013.01); *H01L 51/5253* (2013.01); *H05K 5/0217* (2013.01); *H05K 5/03* (2013.01); *B32B 2307/744* (2013.01); *B32B 2457/20* (2013.01); *G02F 2202/28* (2013.01); *H01L 2251/5338* (2013.01)

(58) Field of Classification Search
CPC ............ B32B 3/18; G09F 3/301; G09F 3/302
See application file for complete search history.

(56) References Cited

U.S. PATENT DOCUMENTS

| 10,164,208 B2 | 12/2018 | Lee et al. |
|---|---|---|
| 10,623,537 B2 | 4/2020 | Lee et al. |

(Continued)

FOREIGN PATENT DOCUMENTS

| KR | 101801357 B1 | 12/2017 |
|---|---|---|
| KR | 1020180079091 A | 7/2018 |

(Continued)

*Primary Examiner* — Zachary M Davis
(74) *Attorney, Agent, or Firm* — Cantor Colburn LLP

(57) ABSTRACT

A display device includes a display module which is foldable and includes a first non-folding area, a folding area and a second non-folding area, in order, a first plate corresponding to the first non-folding area, a second plate corresponding to the second non-folding area and spaced apart from the first plate, and a cover film facing the display module with both the first plate and the second plate therebetween. The cover film includes a first film corresponding to each of the first non-folding area, the folding area and the second non-folding area, the first film attached to each of the first and second plates, and at the folding area, a second film attached to the first film. The display module which is folded disposes the second film between the first film and the first plate and between the first film and the second plate.

18 Claims, 9 Drawing Sheets

(51) Int. Cl.
*B32B 7/14* (2006.01)
*G02F 1/1333* (2006.01)
*B32B 27/08* (2006.01)

(56) References Cited

U.S. PATENT DOCUMENTS

2019/0107866 A1\* 4/2019 Han .................. G06F 3/047
2021/0191459 A1 6/2021 Kim et al.

FOREIGN PATENT DOCUMENTS

| KR | 1020190003257 A | 1/2019 |
| KR | 1020190070725 A | 6/2019 |
| KR | 1020210079461 A | 6/2021 |

\* cited by examiner

DISPLAY DEVICE

This application claims priority to Korean Patent Application No. 10-2020-0064098, filed on May 28, 2020, and all the benefits accruing therefrom under 35 U.S.C. § 119, the entire contents of which are hereby incorporated by reference.

BACKGROUND

(1) Field

Embodiments described herein relates to a display device having improved product reliability.

(2) Description of the Related Art

Display devices display various images on a display screen and provide a user with information. Generally, the information is displayed within a display region of the screen by the display devices.

Flexible display devices including a foldable flexible display panel have been developed. Such a flexible display device may be folded, rolled or curved, unlike rigid display devices. The flexible display device which is deformable into various shapes is portable irrespective of a screen size thereof, and thus, convenience of using the flexible display device may be improved.

SUMMARY

Embodiments provide a display device having improved product reliability.

An embodiment provides a display device which is foldable and includes a first non-folding area, a folding area and a second non-folding area, in order, a first plate corresponding to the first non-folding area, a second plate corresponding to the second non-folding area and spaced apart from the first plate, and a cover film facing the display module with both the first plate and the second plate therebetween. The cover film includes a first film corresponding to each of the first non-folding area, the folding area and the second non-folding area, the first film attached to each of the first and second plates, and at the folding area, a second film attached to the first film. The display module which is folded disposes the second film between the first film and the first plate and between the first film and the second plate.

In an embodiment, the first film may include a first attachment area attached to the first plate; a second attachment area attached to the second plate, and a connection area which connects the first attachment area to the second attachment area. The second film may be attached to the connection area.

In an embodiment, the first attachment area may be attached to a bottom surface of the first plate, and the second attachment area may be attached to a bottom surface of the second plate.

In an embodiment, the connection area may include a central area to which the second film is attached and a peripheral area which is adjacent to the central area.

In an embodiment, a width of the central area may be about 10% to about 40% of a width of the connection area.

In an embodiment, a display device may further a first adhesive layer between the cover film and the first plate; and a second adhesive layer between the cover film and the second plate.

In an embodiment, a display device may further include a set unit below the cover film, a third adhesive layer between the set unit and the cover film and overlapping the first adhesive layer, and a fourth adhesive layer between the set unit and the cover film and overlapping the second adhesive layer.

In an embodiment, the first adhesive layer may have a bar shape extending along a first direction, and the second adhesive layer may have a bar shape extending along the first direction. The first direction may cross a direction along which the first non-folding area, the folding area and the second non-folding area are disposed in order.

In an embodiment, each of widths of the first adhesive layer and the second adhesive layer along the first direction may be substantially the same as a width of the cover film along the first direction.

In an embodiment, the cover film may further include a film adhesive layer which is between the first film and the second film to attach the first film to the second film.

In an embodiment, a gap may be defined between the first plate and the second plate, and the second film may overlap the gap in a plan view.

In an embodiment, each of the first plate and the second plate may have a side surface which defines the gap, and the side surface of each of the first plate and the second plate may include an anti-friction layer.

In an embodiment, the side surface of each of the first plate and the second plate may have a convexly rounded shape towards the gap.

In an embodiment, each of the first film and the second film may have a friction coefficient and a hardness, the friction coefficient of the second film may be lower than the friction coefficient of the first film, and the hardness of the second film may be higher than the hardness of the first film.

In an embodiment, the display module which is unfolded may be flat, and the display module which is folded may dispose the first non-folding area and the second non-folding area facing each other.

In an embodiment, a width L2 of the second film may satisfy Equation 1:

$$2*R < L2 \leq 2*(R+20 \text{ mm}) \quad \text{[Equation 1]}$$

where R is defined as a minimum distance from a folding axis to a bottom surface of the first plate in the display device which is folded.

In an embodiment, the cover film may be a flexible film.

In an embodiment, the first film may include polyurethane resin, and the second film may include polyethylene terephthalate, polyetheretherketone or polyimide.

In an embodiment, the first film may include a top surface adjacent to the first plate and the second plate, and a bottom surface on the opposite side from the top surface. The second film may be attached to the top surface.

In an embodiment, a display device includes a display module including a folding area at which the display module is foldable, a first plate and a second plate adjacent to and spaced apart from each other along the display module, at the folding area, a gap between the first plate and the second plate which are spaced apart from each other, at the gap, the first plate has a side surface and the second plate has a side surface which is spaced apart from and faces the side surface of the first plate, and a cover film facing the display module with both the first plate and the second plate therebetween. The cover film includes a first film attached to each of the first plate and the second plate; and at the folding area, a second film attached to the first film and covering the gap which is between the first plate and the second plate. The display module which is folded disposes the second film of the cover film in contact with both the side surface of the first plate and the side surface of the second plate.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain principles of the invention. In the drawings.

DETAILED DESCRIPTION

Figure 1A:
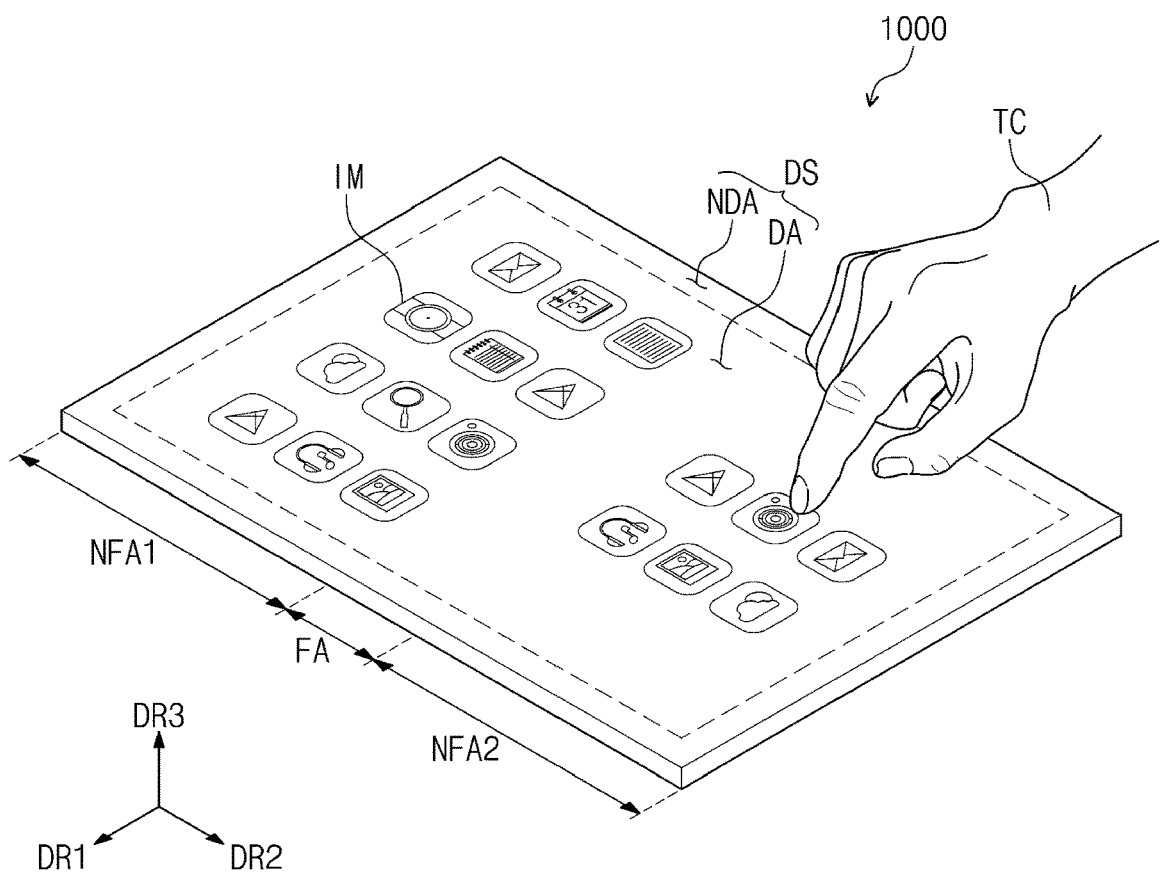
FIG. 1A is a perspective view of an embodiment of a display device.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like numbers refer to like elements throughout. Also, in the drawings, the thicknesses, ratios, and dimensions of the elements are exaggerated for effective description of the technical contents.

It will be understood that when an element (or an region, a layer, a portion, or the like) is referred to as being related to another element such as being "on," "connected to" or "coupled to" another element in the specification, the element can be directly disposed on, connected or coupled to the another element, or intervening elements may be disposed therebetween. In contrast, when an element (or an region, a layer, a portion, or the like) is referred to as being related to another element such as being "directly on," "directly connected to" or "directly coupled to" another element in the specification, no intervening elements are therebetween.

It will be understood that, although the terms first, second, etc. may be used herein to describe various elements, these elements should not be limited by these terms. These terms are only used to distinguish one element from another element. For example, a first element may be referred to as a second element, and similarly, a second element may be referred to as a first element without departing from the scope of the present disclosure. The singular forms are intended to include the plural forms as well unless the context clearly indicates otherwise.

Also, terms such as "below," "lower," "above" and "upper" may be used to describe the relationships of the components illustrated in the drawings. These terms have a relative concept, and are described on the basis of the directions indicated in the drawings.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." The term "and/or" includes any and all combinations of one or more of the associated listed items. It will be further understood that the terms "includes" or "comprises" when used in this specification, specify the presence of stated features, integers, steps, operations, elements, components, or a combination thereof, but do not preclude the presence or addition of one or more other features, integers, steps, operations, elements, components, or combinations thereof.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments will be described with reference to the accompanying drawings.

Figure 1B:
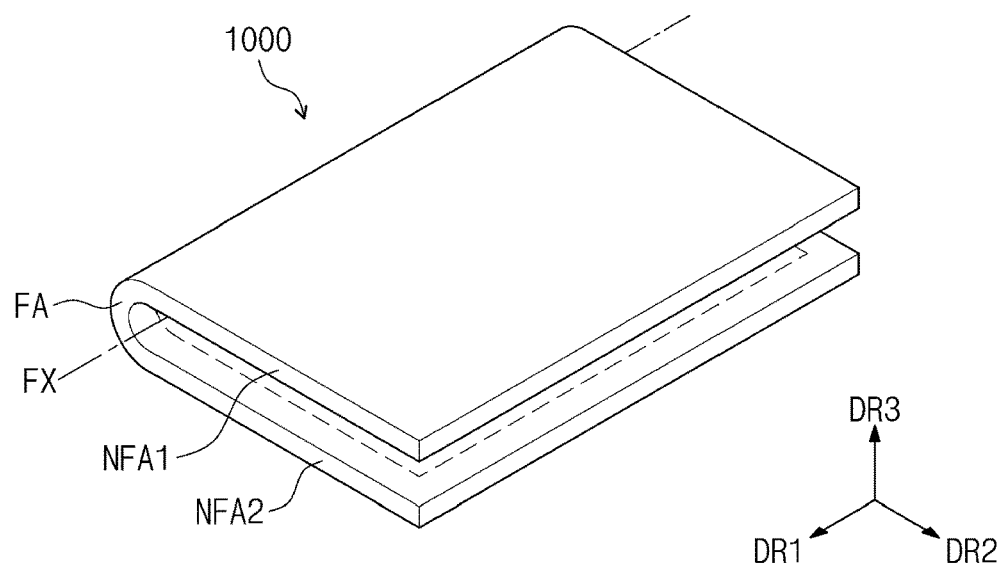
FIG. 1B is a view illustrating the display device illustrated in FIG. 1A, which is folded.

FIG. 1A is a perspective view of an embodiment of a display device 1000. FIG. 1B is a view illustrating the display device 1000 illustrated in FIG. 1A, which is folded.

Referring to FIG. 1A and FIG. 1B, a display device 1000 may be foldable. The display device 1000 may be used in small-to-medium scale electronic apparatuses such as mobile phones, tablets, vehicular navigation devices, game consoles and smart watches, as well as, in large scale electronic apparatuses such as televisions and display monitors.

A top surface of the display device 1000 may be defined as a display surface DS. The display device 1000 which is unfolded may dispose display surface DS in a plane defined by a first direction DR1 and a second direction DR2 which cross each other.

The display surface DS may include a display area DA and a non-display area NDA which is adjacent to the display area DA. The display area DA is a planar area at which an image IM is displayed, and the non-display area NDA is a planar area at which the image IM is not displayed. In FIG. 1A, application icons are illustrated as one example of the image IM.

The display area DA may have a tetragonal shape, in a plan view. In the plan view, the non-display area NDA may surround the display area DA. However, the invention is not limited thereto, and the planar shape of the display area DA and/or the shape of the non-display area NDA may be relatively designed.

In the display device 1000, a first non-folding area NFA1, a folding area FA and a second non-folding area NFA2 may be defined in order along the second direction DR2. That is, the folding area FA may be defined between the first non-folding area NFA1 and the second non-folding area NFA2. A single one of each of the folding area FA and the first and second non-folding areas NFA1 and NFA2 are illustrated in FIGS. 1A and 1B, but the number of the folding area FA and the first and second non-folding areas NFA1 and NFA2 is not limited thereto. The display device 1000 may include more than two, for example, a plurality of non-folding areas and a plurality of folding areas respectively disposed between the non-folding areas.

The display device 1000 may be foldable with respect to a folding axis FX. That is, the display device 1000 may be bendable at the folding area FA with respect to the folding axis FX. The folding axis FX may extend along the first direction DR1. The folding axis FX may be defined as a short axis parallel to the short sides of the display device 1000. The display device 1000 may not be foldable at one or more non-folding area, or may remain flat even when the display device 1000 is folded or bent with respect to the folding axis FX, without being limited thereto.

Referring to FIG. 1B, the display device 1000 which is folded disposes a portion of the display surface DS at the first non-folding area NFA1 and a portion of the display surface DS at the second non-folding area NFA2 facing each other. Thus, the display surface DS may not be exposed to or may not face outside of the display device 1000 which is folded. However, this is merely an example, and the embodiment is not limited thereto. In an embodiment, the display device 1000 which is folded about the folding axis FX may dispose a portion of the display surface DS at the first non-folding area NFA1 and a portion of the display surface DS at the second non-folding area NFA2 facing in opposite directions from each other. Thus, the display surface DS may be exposed to or face the outside of the display device 1000 which is folded.

Figure 2A:
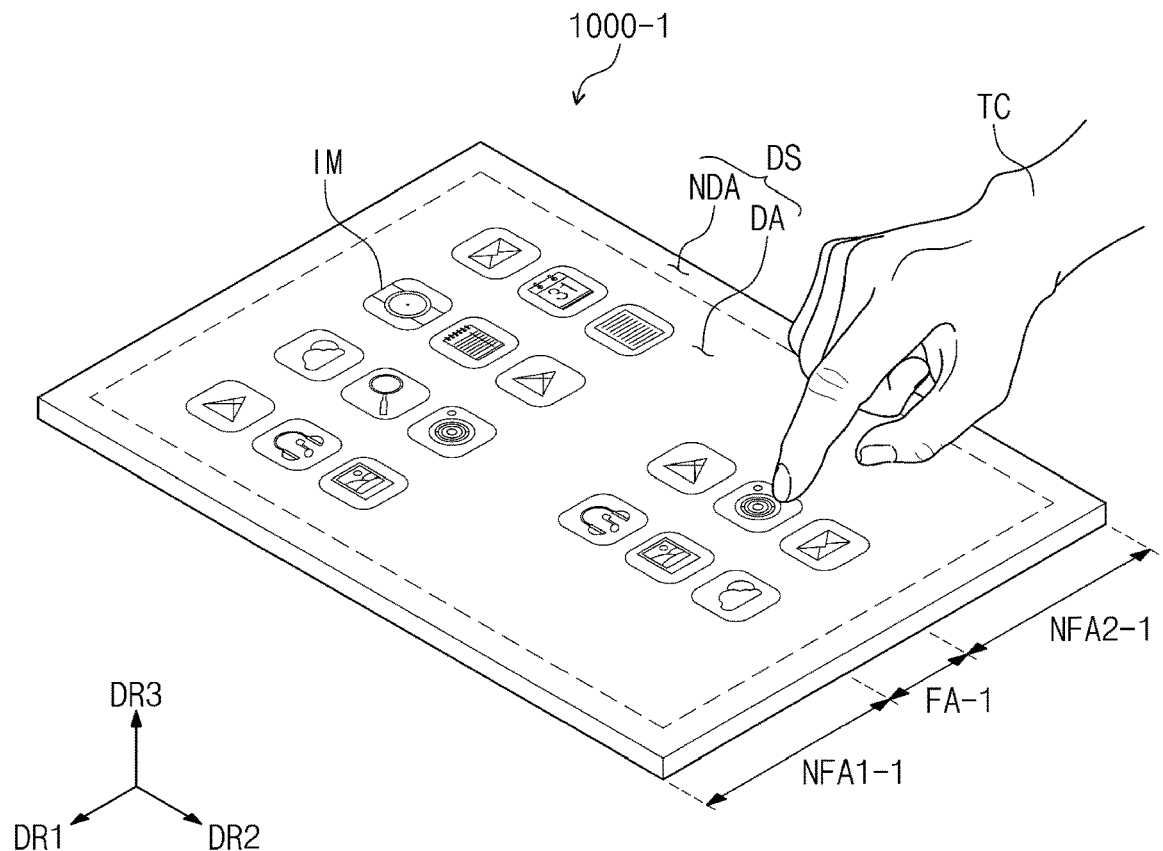
FIG. 2A is a perspective view of an embodiment of a display device.
Figure 2B:
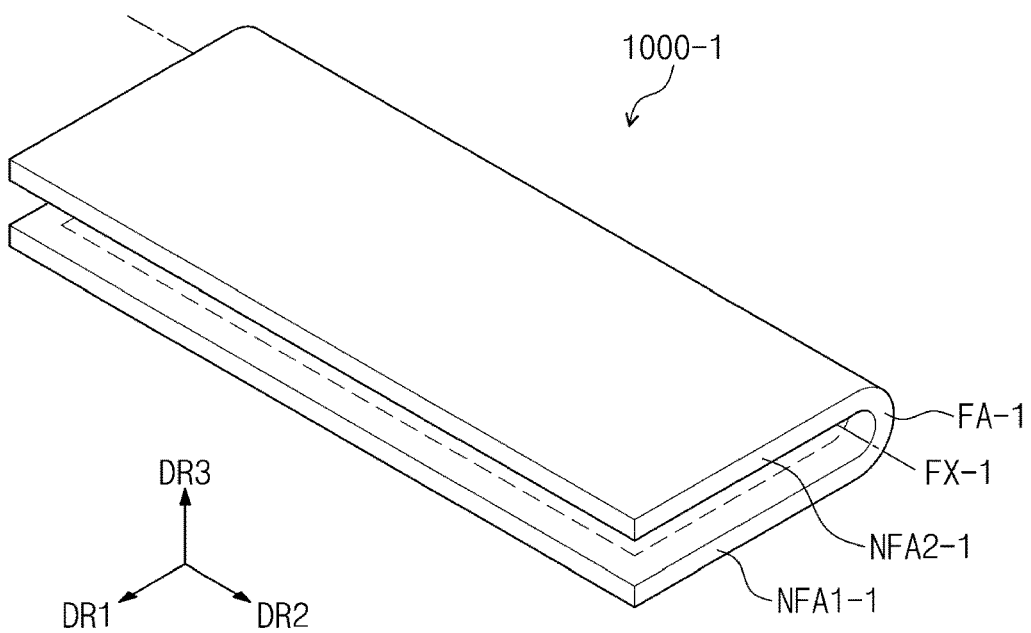
FIG. 2B is a view illustrating the display device illustrated in FIG. 2A, which is folded.

FIG. 2A is a perspective view of an embodiment of a display device 1000-1. FIG. 2B is a view illustrating the display device 1000-1 illustrated in FIG. 2A, which is folded.

Referring to FIG. 2A and FIG. 2B, in a display device 1000-1, a first non-folding area NFA1-1, a folding area FA-1 and a second non-folding area NFA2-1 may be defined in order along a first direction DR1. The folding area FA-1 may be defined between the first non-folding area NFA1-1 and the second non-folding area NFA2-1.

The display device 1000-1 may be foldable with respect to a folding axis FX-1. That is, the display device 1000-1 may be bendable at the folding area FA-1 with respect to the folding axis FX-1. The folding axis FX-1 may extend along a second direction DR2. The folding axis FX-1 may be defined as the long axis parallel to the long sides of the display device 1000-1.

Hereinafter, a structure of the display device 1000 which is folded with respect to the short axis will be described. However, the embodiment is not limited thereto, and structures described herein may also be applied to the display device 1000-1 which is folded with respect to the long axis. The display device 1000 and various components or layers thereof, may include a display area DA and a non-display area NDA corresponding to those describe above.

Figure 3A:
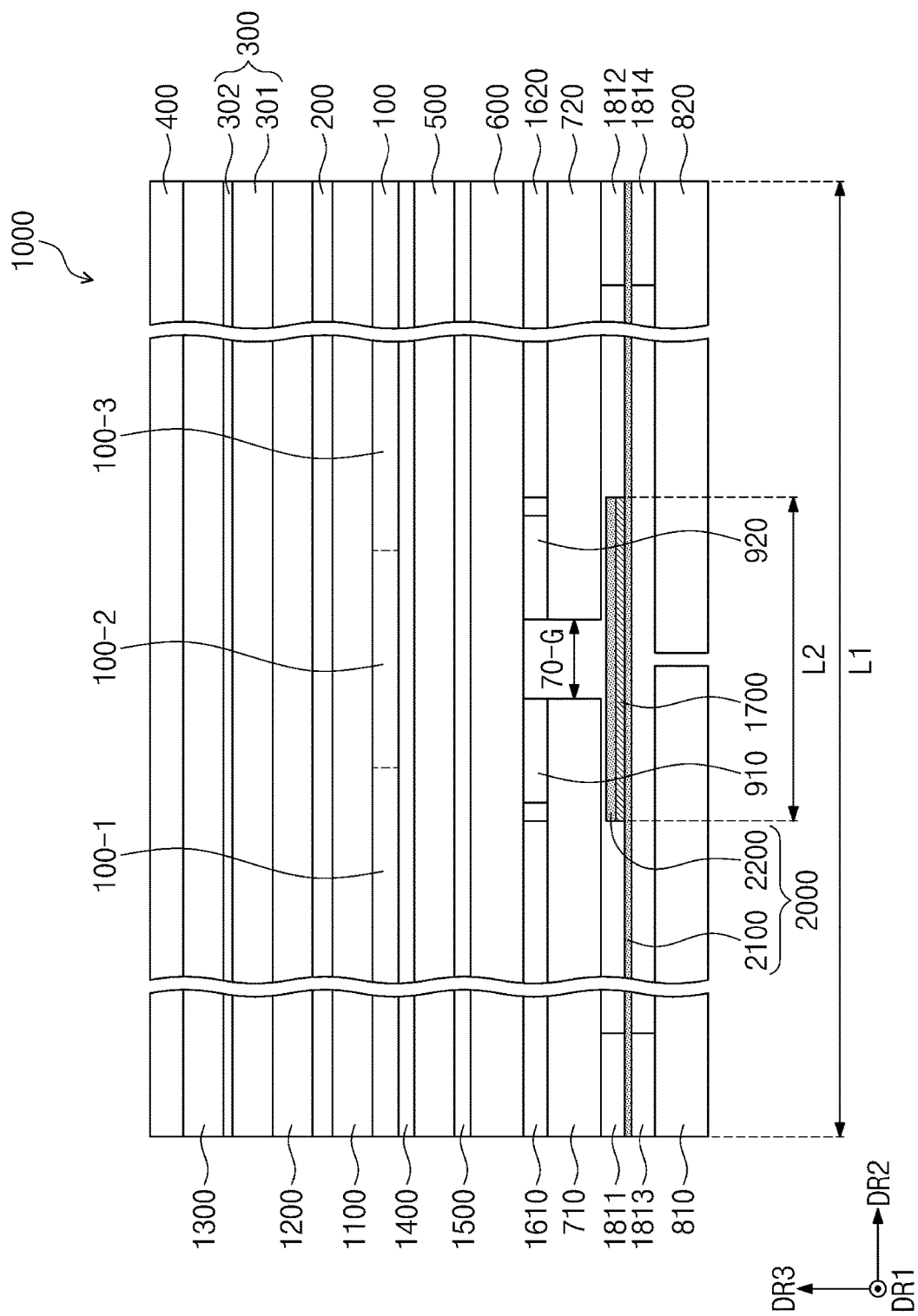
FIG. 3A is a cross-sectional view of an embodiment of a display device.
Figure 3B:
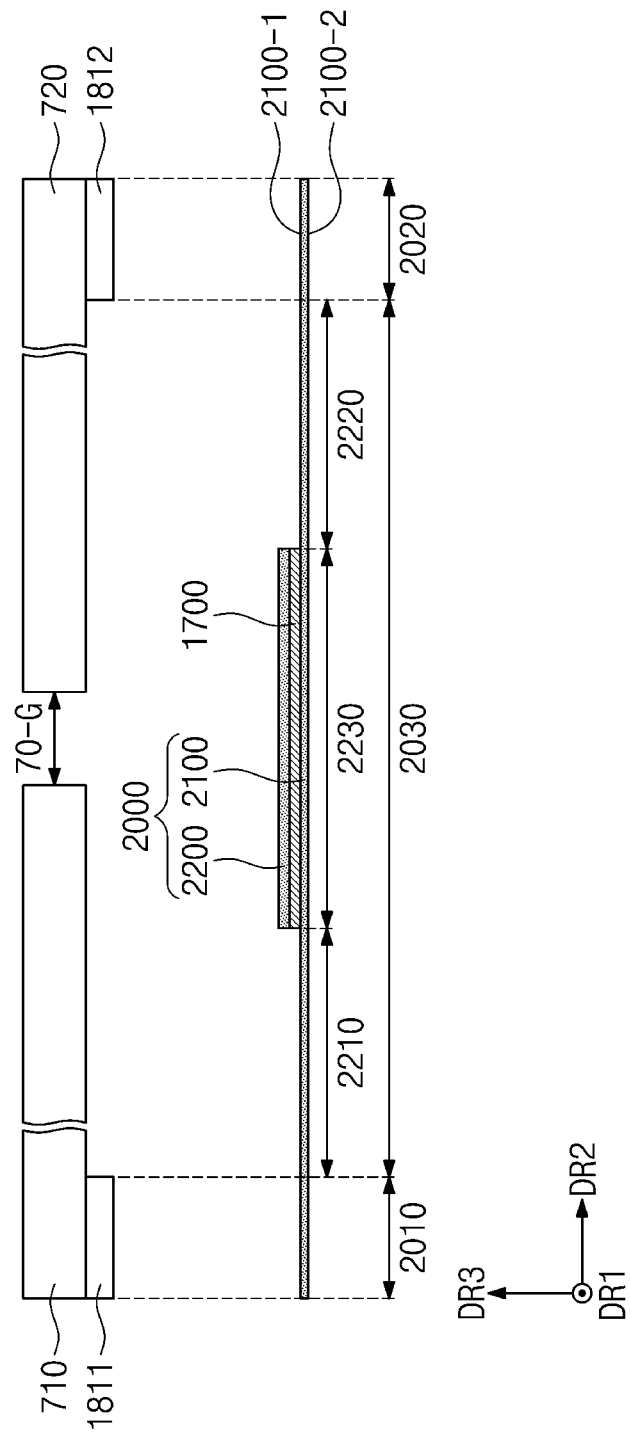
FIG. 3B is a cross-sectional view illustrating an embodiment of a display device.
Figure 3C:
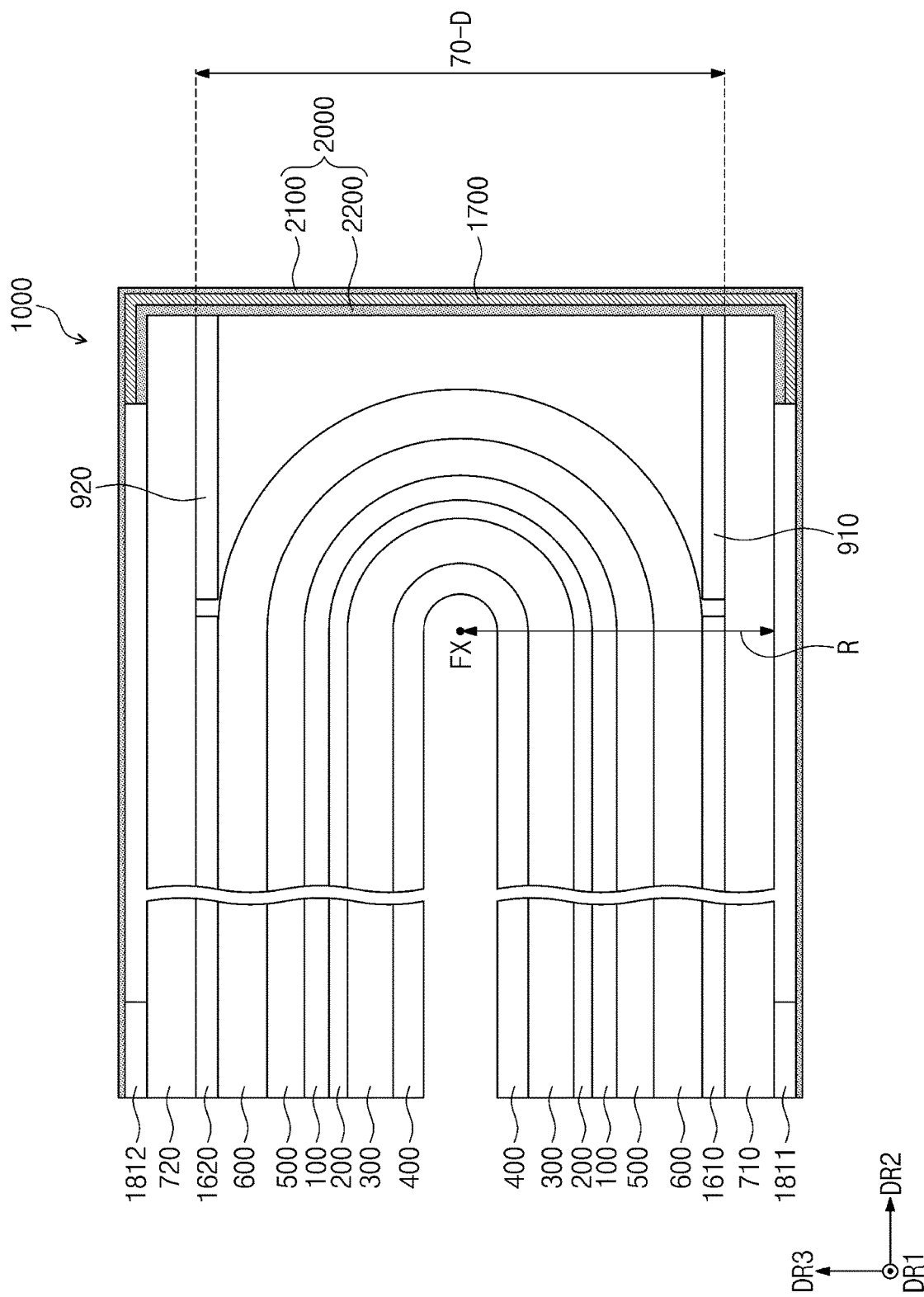
FIG. 3C is a cross-sectional view illustrating an embodiment of a display device and components thereof which are folded.

FIG. 3A is a cross-sectional view of an embodiment of a display device 1000. FIG. 3B is a cross-sectional view illustrating an embodiment of a portion of a display device 1000. FIG. 3C is an enlarged cross-sectional view illustrating an embodiment of a portion of a display device 1000 which is folded.

FIGS. 3B and 3C schematically illustrate only some components of the display device 1000. Among components illustrated in FIG. 3A, a first plate 710, a second plate 720, a first adhesive member 1811 (e.g., first adhesive pattern), a second adhesive member 1812 (e.g., second adhesive pattern), and a cover film 2000 are schematically illustrated in FIG. 3B. For convenience of description, FIG. 3B illustrates the first plate 710, the second plate 720, the first adhesive member 1811, the second adhesive member 1812 and the cover film 2000 which are flat or unfolded and separated from each other. Adhesive layers 1100, 1200, 1300, 1400 and 1500, a first set unit 810, a second set unit 820, a third adhesive member 1813 (e.g., third adhesive pattern), and a fourth adhesive member 1814 (e.g., fourth adhesive pattern) of FIG. 3A are omitted in FIG. 3C. Hereinafter, a display device 1000 will be described with reference to FIGS. 3A to 3C.

Referring to FIG. 3A, a display device 1000 may include a display module 100, an anti-reflection layer 200, a window 300, an upper protective film 400, a lower protective film 500, a cushion layer 600, a first plate 710, a second plate 720, a first set unit 810, and a second set unit 820.

The display module 100 may generate and display the image IM (see FIG. 1A) and sense an external input TC (see FIG. 1A). The external input TC may be applied from various input tools such as a portion of the user's body, light, heat, a pen or pressure. In FIG. 1A, the external input TC which is sensed by the display device 1000 is illustrated as a hand of a body which is applied to or proximate to the display surface DS. However, this is merely illustrated as an example, and as described above, the external input TC may be provided as various types. In an embodiment, the external input TC which is sensed by the display device 1000 may be applied to the side surface or the bottom surface of the display device 1000 according to the structure of the display device 1000.

The display module 100 may include a display panel for generating and/or displaying an image IM and an input sensing layer for acquiring coordinate information about an external input TC.

The display panel may be a light emitting-type display panel, but is not particularly limited thereto. In an embodiment, for example, the display panel may be an organic light emitting display panel or a quantum-dot light emitting display panel. A light emitting layer of the organic light emitting display panel may include an organic light emitting material. A light emitting layer of the quantum-dot light emitting display panel may include quantum dots, quantum rods or the like.

The input sensing layer may be disposed on the display panel. In an embodiment, for example, the input sensing layer may be formed directly on the display panel, such as through a continuous process. The input sensing layer may include a plurality of insulating layers and a plurality of conductive layers. The plurality of conductive layers may provide a sensing electrode for sensing an external input TC, a sensing wire connected to the sensing electrode, and a sensing pad connected to the sensing wire. The input sensing layer may sense the external input TC by using a mutual capacitance method and/or a self capacitance method. However, a method for sensing the external input TC is not limited to the above-described examples.

A first area 100-1, a second area 100-2 and a third area 100-3 may be defined in the display module 100. The first area 100-1, the second area 100-2 and the third area 100-3 may be defined in order along the second direction DR2. The first area 100-1 may correspond to the first non-folding area NFA1 of FIG. 1A, the second area 100-2 may correspond to the folding area FA of FIG. 1A, and the third area 100-3 may correspond to the second non-folding area NFA2 of FIG. 1A. That is, each of the first area 100-1 and the third area 100-3 may be a portion of the display module 100 which is non-folding, and the second area 100-2 may be a portion of the display module 100 which foldable.

The anti-reflection layer 200 may be disposed above the display module 100. The reflectivity of external light incident from outside of the anti-reflection layer 200 may be reduced. The anti-reflection layer 200 may include a phase retarder and a polarizer. The phase retarder may be a film type or a liquid crystal coating type and may include a λ/2 phase retarder and/or a λ/4 phase retarder. The polarizer may also be a film type or a liquid crystal coating type. The film type may include an elongated synthetic resin film, and the liquid crystal coating type may include liquid crystals. The phase retarder and the polarizer may further include protective films.

Also, the anti-reflection layer 200 may include color filters. Taking into consideration light emission colors of display pixels provided in the display panel, the arrangement of the color filters may be determined. The anti-reflection layer 200 may further include a black matrix adjacent to the color filters.

Also, the anti-reflection layer 200 may include a destructive interference structure. In an embodiment, for example, the destructive interference structure may include a first reflection layer and a second reflection layer which are disposed on different layers. First reflection light and second reflection light, which are reflected from the first reflection layer and the second reflection layer, respectively, may be destructively interfered, and thus, the reflectivity of external light is reduced.

A first adhesive layer 1100 may be disposed between the display module 100 and the anti-reflection layer 200. The display module 100 and the anti-reflection layer 200 may be coupled to each other by the first adhesive layer 1100. In an embodiment, the first adhesive layer 1100 may be omitted. The adhesive layers may include a general bonding agent or adhesive. In an embodiment, for example, each of the adhesive layers may be a pressure sensitive adhesive ("PSA"), an optical clear adhesive ("OCA") or an optical clear resin ("OCR").

The window 300 may be disposed above the anti-reflection layer 200. The window 300 may include a base layer 301 and a functional layer 302. The base layer 301 may include a glass substrate and/or a synthetic resin film. In an embodiment, for example, the base layer 301 may include a polyimide film. The base layer 301 is not limited to a single material layer. The base layer 301 may include two or more films coupled to each other, such as by an adhesive member. The functional layer 302 may include at least one of an anti-fingerprint layer, an anti-reflection member or layer and a hard coating layer.

A second adhesive layer 1200 may be disposed between the window 300 and the anti-reflection layer 200. However, the embodiment is not limited thereto, and the second adhesive layer 1200 may be omitted.

The upper protective film 400 may be disposed above the window 300. The impact resistance characteristics of the display device 1000 may be enhanced by adding the upper protective film 400. The upper protective film 400 may be a polymer film or a tempered glass film. A third adhesive layer 1300 may be disposed between the upper protective film 400 and the window 300, but the third adhesive layer 1300 may be omitted. Also, in an embodiment, the upper protective film 400 may be omitted.

The lower protective film 500 may be disposed below the display module 100. The lower protective film 500 may be a layer for protecting the bottom surface of the display module 100. The lower protective film 500 may include a synthetic resin film, for example, which may be a polyimide film or a polyethylene terephthalate film. However, this is merely an example, and the lower protective film 500 is not limited to the above-described example. A fourth adhesive layer 1400 may be disposed between the lower protective film 500 and the display module 100.

The cushion layer 600 may be disposed below the lower protective film 500. The cushion layer 600 may include sponge, foam, a urethane resin, or the like. A fifth adhesive layer 1500 may be disposed between the lower protective film 500 and the cushion layer 600.

The first plate 710 and the second plate 720 may be disposed below the cushion layer 600. The first plate 710 and the second plate 720 may be coplanar with each other, in the display device 1000 which is unfolded. The first plate 710 may be disposed below the first area 100-1 of the display module 100, and the second plate 720 may be disposed below the third area 100-3 of the display module 100. A portion of the first plate 710 and a portion of the second plate 720 may be disposed below the second area 100-2. The first plate 710 and the second plate 720 may be disconnected from each other at the folding area FA. The display device 1000 which is unfolded, disposes the first plate 710 and the second plate 720 spaced a distance from each other. That is, a gap 70-G may be defined between the first plate 710 and the second plate 720 which are spaced apart from each other. Each of the first plate 710 and the second plate 720 may have a side surface at the folding area FA, and the side surface of the first plate 710 faces the side surface of the second plate 720 to define the gap 70-G therebetween.

Each of the first plate 710 and the second plate 720 may be a metal plate. In an embodiment, for example, each of the first plate 710 and the second plate 720 may include stainless steel, aluminum or an alloy thereof. Each of the display module 100, the first plate 710 and the second plate 720 may have a strength, such as a mechanical strength. The strength of each of the first plate 710 and the second plate 720 may be greater than the strength of the display module 100.

A first intermediate adhesive layer 1610 may be disposed between the cushion layer 600 and the first plate 710. A second intermediate adhesive layer 1620 may be disposed between the cushion layer 600 and the second plate 720. The first intermediate adhesive layer 1610 and the second intermediate adhesive layer 1620 may be coplanar with each other, in the display device 1000 which is unfolded. Each of the first intermediate adhesive layer 1610 and the second intermediate adhesive layer 1620 may be adhesive on both of opposing surfaces thereof.

Along a third direction DR3 parallel to a thickness direction of the display device 1000 and crossing each of the first direction DR1 and the second direction DR2, the first intermediate adhesive layer 1610 may overlap the first area 100-1 and the second intermediate adhesive layer 1620 may overlap the third area 100-3. Also, the first intermediate adhesive layer 1610 and the second intermediate adhesive layer 1620 may not overlap the second area 100-2. That is, the first intermediate adhesive layer 1610 and the second intermediate adhesive layer 1620 may be spaced apart from the second area 100-2, along the second direction DR2, in the display device 1000 which is unfolded.

A first height difference compensating film 910 may be disposed between the cushion layer 600 and the first plate 710. A second height difference compensating film 920 may be disposed between the cushion layer 600 and the second plate 720. Each of the first height difference compensating film 910 and the second height difference compensating film 920 may have an adhesive force. In each of the first height difference compensating film 910 and the second height difference compensating film 920, a first surface thereof may have an adhesive force which is lower than an adhesive force of a second surface which is opposite to the first surface thereof. In an embodiment, for example, the first surface may not have an adhesive force (e.g., non-adhesive). The first surface which is non-adhesive may be a surface which is closest to the cushion layer 600, e.g., furthest from a respective plate among the first surface and the second surface.

The first height difference compensating film 910 may be adjacent to the first intermediate adhesive layer 1610, and the second height difference compensating film 920 may be adjacent to the second intermediate adhesive layer 1620. Thus, the first intermediate adhesive layer 1610, the first height difference compensating film 910, the second height difference compensating film 920 and the second intermediate adhesive layer 1620 may be disposed in this order along a second direction DR2. The display device 1000 which is unfolded may dispose the first intermediate adhesive layer 1610, the first height difference compensating film 910, the second height difference compensating film 920 and the second intermediate adhesive layer 1620 coplanar with each other or in a same layer as each other.

In a plan view, both of the first height difference compensating film 910 and the second height difference compensating film 920 may overlap the second area 100-2. In the display module 100 which is unfolded, that is, where the display module 100 is flat, the second area 100-2 of the display module 100 may be supported along the third direction DR3 by the first height difference compensating film 910 and the second height difference compensating film 920. The display module 100 which is unfolded or flat, may dispose the first height difference compensating film 910 and the second height difference compensating film 920 in contact with the cushion layer 600. As being in contact, elements may form an interface therebetween. In the display module 100 which is folded, the first height difference compensating film 910 and the second height difference compensating film 920 may be spaced apart from the cushion layer 600.

Referring to FIGS. 3A and 3B together, a cover film 2000 may be attached to the first plate 710 and the second plate 720. The cover film 2000 may cover at least a portion of a space between the first plate 710 and the second plate 720. The cover film 2000 may be disposed to overlap the gap 70-G which is defined between the first plate 710 and the second plate 720.

The cover film 2000 (e.g., cover layer) includes a first film 2100 (e.g., first layer) and a second film 2200 (e.g., second layer). The second film 2200 may be attached to one surface of the first film 2100.

The cover film 2000 may be flexible. Each of the first film 2100 and the second film 2200 included in the cover film 2000 may be flexible.

The first film 2100 may include a material robust to repeated elongation and contraction. The first film 2100 may include a material having elastic modulus of about 30 megapascals (Mpa) or less and an elongation percentage of about 100% or more. In an embodiment, for example, the first film 2100 may include at least one of an acryl-based resin, a methacryl-based resin, polyisoprene, a vinyl-based resin, an epoxy-based resin, a urethane-based resin, a cellulose-based resin, a siloxane-based resin, a polyimide-based resin, a polyamide-based resin and a perylene-based resin. In an embodiment, for example, the first film 2100 may include a thermoplastic polyurethane material layer.

Each of the first film 2100 and the second film 2200 may have a friction coefficient and a hardness. The second film 2200 may include a scratch resistant material to have a friction coefficient which is lower than the friction coefficient of the first film 2100, and a hardness which is higher than the hardness of the first film 2100. In an embodiment, for example, the second film 2200 may include at least one of polyethylene terephthalate ("PET"), polyetheretherketone ("PEEK") and polyimide ("PI").

A film adhesive layer 1700 may be disposed between the first film 2100 and the second film 2200. That is the first film 2100 and the second film 2200 may be disposed facing each other with the film adhesive layer 1700 therebetween. The first film 2100 and the second film 2200 may be attached to each other by the film adhesive layer 1700. The film adhesive layer 1700 may be a pressure sensitive adhesive ("PSA"), an optical clear adhesive ("OCA") or an optical clear resin ("OCR"). In an embodiment, the film adhesive layer 1700 may be omitted.

The first film 2100 may include a top surface 2100-1 which is closest to the second film 2200 along the third direction DR3, and a bottom surface 2100-2 which is opposite to the top surface 2100-1 and furthest from the second film 2200 along the third direction DR3. The top surface 2100-1 of the first film 2100 may be a surface which is adjacent to (e.g., closest to) the first plate 710 and the second plate 720, and the bottom surface 2100-2 of the first film 2100 may be a surface which is at an opposite side from the top surface 2100-1 and adjacent to (e.g., closest to) the first set unit 810 and the second set unit 820. The second film 2200 may be attached to the first film 2100 at the top surface 2100-1 of the first film 2100.

The first film 2100 may include a first attachment area 2010, a second attachment area 2020, and a connection area 2030. The first attachment area 2010 may be attached to the first plate 710, and the second attachment area 2020 may be attached to the second plate 720. In an embodiment, for example, the first attachment area 2010 may be attached to the first plate 710 at the bottom surface of the first plate 710, and the second attachment area 2020 may be attached to the second plate 720 at the bottom surface of the second plate 720.

A first adhesive member 1811 may be disposed between the first film 2100 and the first plate 710, and a second adhesive member 1812 may be disposed between the first film 2100 and the second plate 720. The first adhesive member 1811 may overlap or correspond to the first attachment area 2010 of the first film 2100, and the second adhesive member 1812 may overlap or correspond to the second attachment area 2020 of the first film 2100.

The first plate 710 may be coupled to the first set unit 810, and the second plate 720 may be coupled to the second set unit 820. The first set unit 810 and the second set unit 820 may include a camera module, a main board, a battery and/or a housing. The first set unit 810 and/or the second set unit 820 may be otherwise referred to as a function layer or a component layer in which a component such as the camera module providing a function of the display device 1000 is disposed. A third adhesive member 1813 may be disposed between the first film 2100 and the first set unit 810, and the fourth adhesive member 1814 may be disposed between the first film 2100 and the second set unit 820.

The first film 2100 may have planar areas defined along the first direction DR1 together with the second direction DR2, such as a width along the second direction DR2. The display device 1000 which is deformed may change the widths of areas of the first film 2100 which are not attachable to the first to fourth adhesive members 1811, 1812, 1813, and 1814. That is, the width of the connection area 2030 of the first film 2100 may be changeable or variable. The display device 1000 which is unfolded or flat may define one width of the connection area 2030, while the display device 1000 which is folded or bent may define another width of the connection area 2030 which is different from the one width.

The connection area 2030 may connect the first attachment area 2010 to the second attachment area 2020. The second film 2200 may be attached to the first film 2100 at the connection area 2030 of the first film 2100. The connection area 2030 may include a central area 2230 to which the second film 2200 is attached and peripheral areas which are respectively adjacent to ends of the central area 2230. The peripheral areas may include a first peripheral area 2210 and a second peripheral area 2220. The first peripheral area 2210 may be a planar area between a planar area of the first attachment area 2010 and a planar area of the central area 2230, and the second peripheral area 2220 may be a planar area between a planar area of the second attachment area 2020 and a planar area of the central area 2230.

The display device 1000 which is deformed may define a change in the width of the central area 2230 to which the second film 2200 is attached which is smaller than a change in the width of the peripheral areas which are not attachable to the second film 2200. That is, the change in width of the peripheral areas may be larger than the change in width of the central area 2230.

Referring to FIGS. 3A to 3C, a space between the first plate 710 and the second plate 720 may be changeable according to the shape of the display device 1000 which is foldable. In an embodiment, for example, as illustrated in FIG. 3C, the display device 1000 which is folded defines a distance 70-D along the third direction DR3 between the first plate 710 and the second plate 720 which is maximum. Also, the display device 1000 which is folded disposes the folding area FA uncovered by the first plate 710 and the second plate 720. The display device 1000 which is folded disposes a portion of the first plate 710 and a portion of the second plate 720 detached and spaced apart from the cushion layer 600. As the portion of the first plate 710 and the portion of the second plate 720 are spaced apart from the cushion layer 600, the bottom surface of the cushion layer 600 may be exposed at the folding area FA and/or the second area 100-2.

The display device 1000 which is unfolded (FIG. 3A) disposes the second film 2200 included in the cover film 2000 non-contacting with the first plate 710 and the second plate 720. The display device 1000 which is folded disposes the second film 2200 included in the cover film 2000 to be in contact with the first plate 710 and the second plate 720. More particularly, the display device 1000 which is folded disposes the second film 2200 which includes a material having scratch resistant properties as compared to the first film 2100 (e.g., more scratch resistant than the first film 2100), to be in contact with edge portions (e.g., end side surfaces) of the first plate 710 and the second plate 720.

The display device 1000 which is folded disposes the cover film 2000 covering the bottom surface of the cushion layer 600. By the cover film 2000 extending across the gap 70-G and the distance 70-D to be disposed below the first plate 710 and the second plate 720 in the display device 1000, flowing of foreign particles toward the cushion layer 600 and the display module 100 may be reduced or effectively prevented, even in the display device 1000 which is folded. Referring to FIG. 3C, where the display device 1000 is folded, the cover film 2000 comes into contact with the edge portions of the first plate 710 and the second plate 720, and friction is induced. Thus, the cover film 2000 may be damaged due to repeated folding and unfolding of the display device 1000. However, in one more embodiment of the display device 1000, since the second film 2200 including the scratch resistant material is disposed closer to the first plate 710 and the second plate 720 than the first film 2100, damage of the cover film 2000 due to the friction with the edge portions of the first plate 710 and the second plate 720 may be reduced or effectively prevented. Thus, the cover film 2000 having high durability even in a repeated folding and unfolding environment may be provided, thereby improving the durability and reliability of the display device 1000.

Referring to FIGS. 3A to 3C again, the width of the first attachment area 2010 of the first film 2100 may correspond to the width of the first adhesive member 1811 along the second direction DR2, and the width of the second attachment area 2020 may correspond to the width of the second adhesive member 1812 along the second direction DR2. Each of the width of the first adhesive member 1811 along the second direction DR2 and the width of the second adhesive member 1812 along the second direction DR2 may be about 3 millimeters (mm) to about 10 mm. However, the width of each of the first adhesive member 1811 and the second adhesive member 1812 is not limited to the above-described example, and may be variously modified according to product design.

A width L1 of the first film 2100 along the second direction DR2 may correspond to a total width of the display device 1000 along the second direction DR2. In an embodiment, the width L1 of the first film 2100 may be about 60 mm to about 220 mm. In the first film 2100, a total width of the connection area 2030 may be about 50 mm to about 200 mm. A width of the central area 2230 of the connection area 2030 may correspond to a width L2 of the second film 2200 along the second direction DR2. The width L2 of the second film 2200 may be greater than a gap width of the gap 70-G defined between the first plate 710 and the second plate 720. The width L2 of the second film 2200 may be about 5 mm to about 50 mm. The width L2 of the second film 2200 may be about 10% to about 40% of the total width of the connection area 2030. The width L2 of the second film 2200 may be modified depending on the folding characteristics of the display device 1000. More particularly, the width L2 of the second film 2200 may satisfy Equation 1:

$$2*R < L2 \leq 2*(R+20 \text{ mm})$$ [Equation 1]

where R is defined as a minimum distance R from a folding axis FX to a bottom surface of the first plate 710 in the display device 1000 which is folded. Referring to FIG. 3C, the display device 1000 which is folded defines the minimum distance R from the folding axis FX to a bottom surface of the first plate 710 which is furthest from the folding axis FX along the third direction DR3.

That is, the width L2 of the second film 2200 may be greater than two times the minimum distance R from the folding axis FX to the bottom surface of the first plate 710, and may be equal to or less than two times the sum of about 20 mm and the minimum distance R. As the width L2 of the second film 2200 satisfies the above numerical range and Equation 1, damage of the cover film 2000 due to the friction with the edge portions of the first plate 710 and the second plate 720 may be reduced or effectively prevented while the elongation characteristics of the cover film 2000 is not deteriorated.

Figure 4:
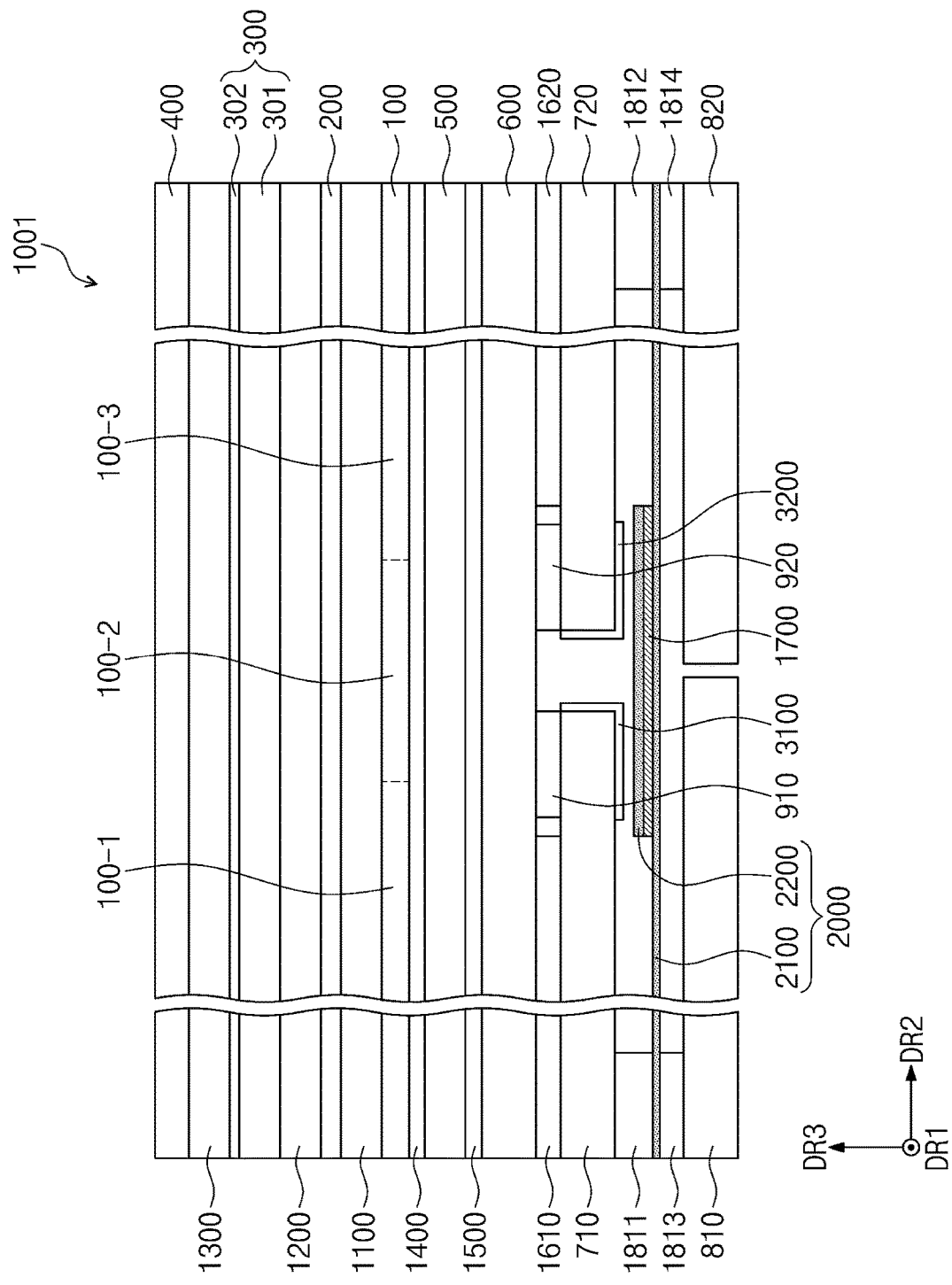
FIGS. 4 and 5 are cross-sectional views of embodiments of display devices.
Figure 5:
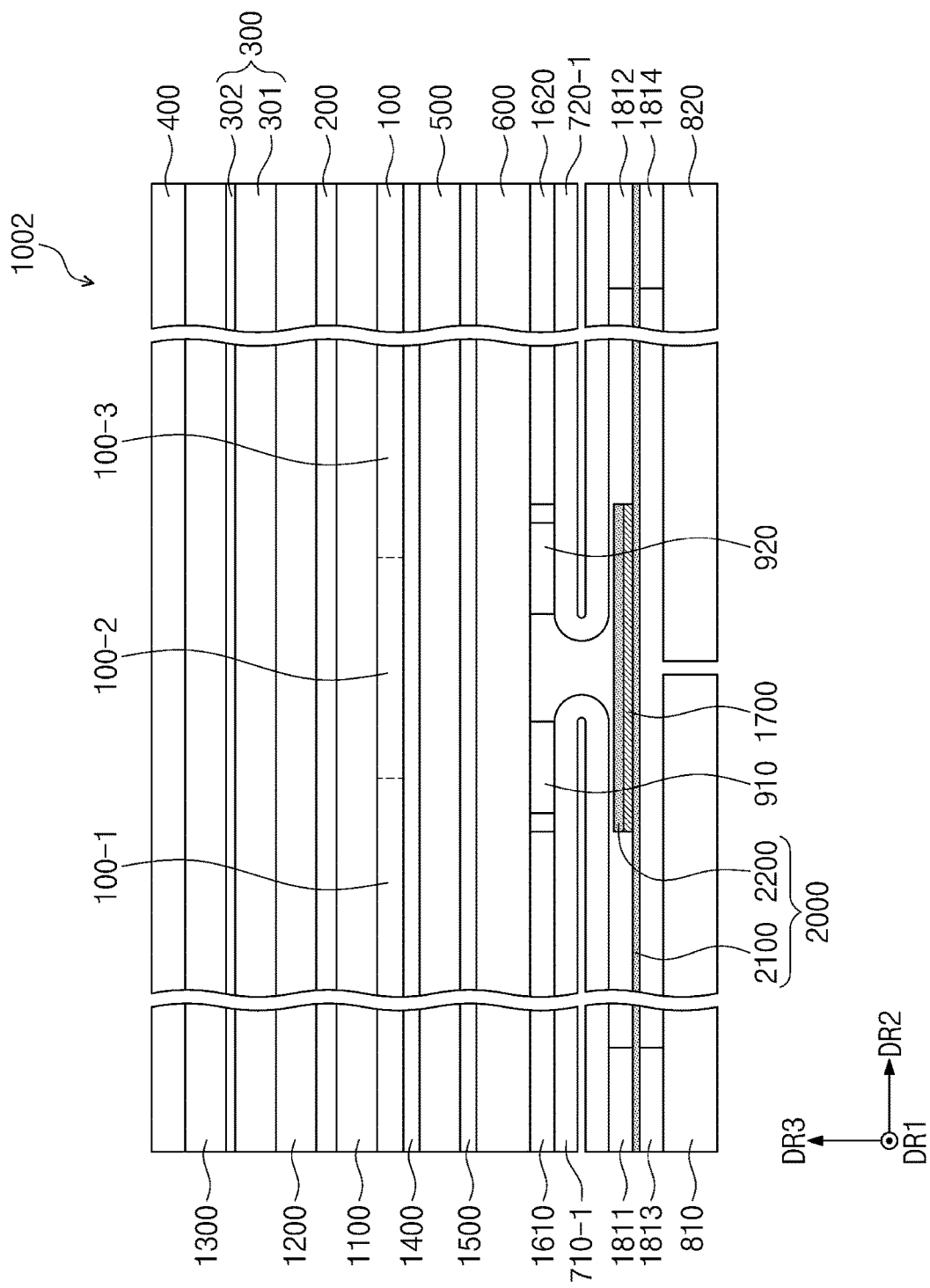

FIGS. 4 and 5 are cross-sectional views of embodiments of display devices. Hereinafter, when describing a display device 1001 and a display device 1002 with reference to FIGS. 4 and 5, the same reference symbols are given to components that are the same as those described above in FIGS. 3A to 3C, and their detailed descriptions will be omitted.

Referring to FIG. 4, a display device 1001 may further include anti-friction layers which are disposed on the side surfaces of a first plate 710 and a second plate 720, respectively, such that the side surfaces each include an anti-friction layer. The anti-friction layers may include a first anti-friction layer 3100 disposed on the side surface of the first plate 710 and a second anti-friction layer 3200 disposed on the side surface of the second plate 720. The first anti-friction layer 3100 and the second anti-friction layer 3200 may be disposed to cover inner side surfaces of the first plate 710 and the second plate 720 at the gap 70-G (see FIG. 3A) defined between the first plate 710 and the second plate 720, and further cover portions of bottom surfaces of the first plate 710 and the second plate 720. Each of the first anti-friction layer 3100 and the second anti-friction layer 3200 may include a material that reduces friction.

In an embodiment of providing the display device 1001, the first anti-friction layer 3100 and the second anti-friction layer 3200 may be applied to the inner side surfaces of the first plate 710 and the second plate 720, respectively, to form the layers. Alternatively, the first anti-friction layer 3100 and the second anti-friction layer 3200 may be provided as films which are separate from the respective plates and then attached to the inner side surfaces of the first plate 710 and the second plate 720, respectively, such as through adhesive layers (not shown). The display device 1001 includes the anti-friction layers disposed on the inner side surfaces of the first plate 710 and the second plate 720 at the gap 70-G therebetween. Thus, damage to a cover film 2000 due to edges of the first plate 710 and the second plate 720 contacting the cover film 2000 when the display device 1001 is folded, may be reduced or effectively prevented. Referring to FIGS. 3C and 4, for example, the second film 2200 would contact the first anti-friction layer 3100 and the second anti-friction layer 3200 at the respective side surfaces of the first plate 710 and the second plate 720.

Referring to FIG. 5, in a display device 1002, each of a first plate 710-1 and a second plate 720-1 may have a hemmed structure. As a hemmed structured, inner side surfaces of the first plate 710-1 and the second plate 720-1 at the gap 70-G therebetween may have a curved or rounded shape. At the gap 70-G, the side surface of the first plate 710 and the side surface of the second plate 720 may be convexly rounded towards the gap 70-G. In the display device 1002, the inner side surfaces of the first plate 710-1 and the second plate 720-1 at the gap 70-G have the round shape. Thus, damage to a cover film 2000 due to sharp edges of the first plate 710-1 and the second plate 720-1 may be reduced or effectively prevented in folding and unfolding of the display device 1002.

Figure 6:
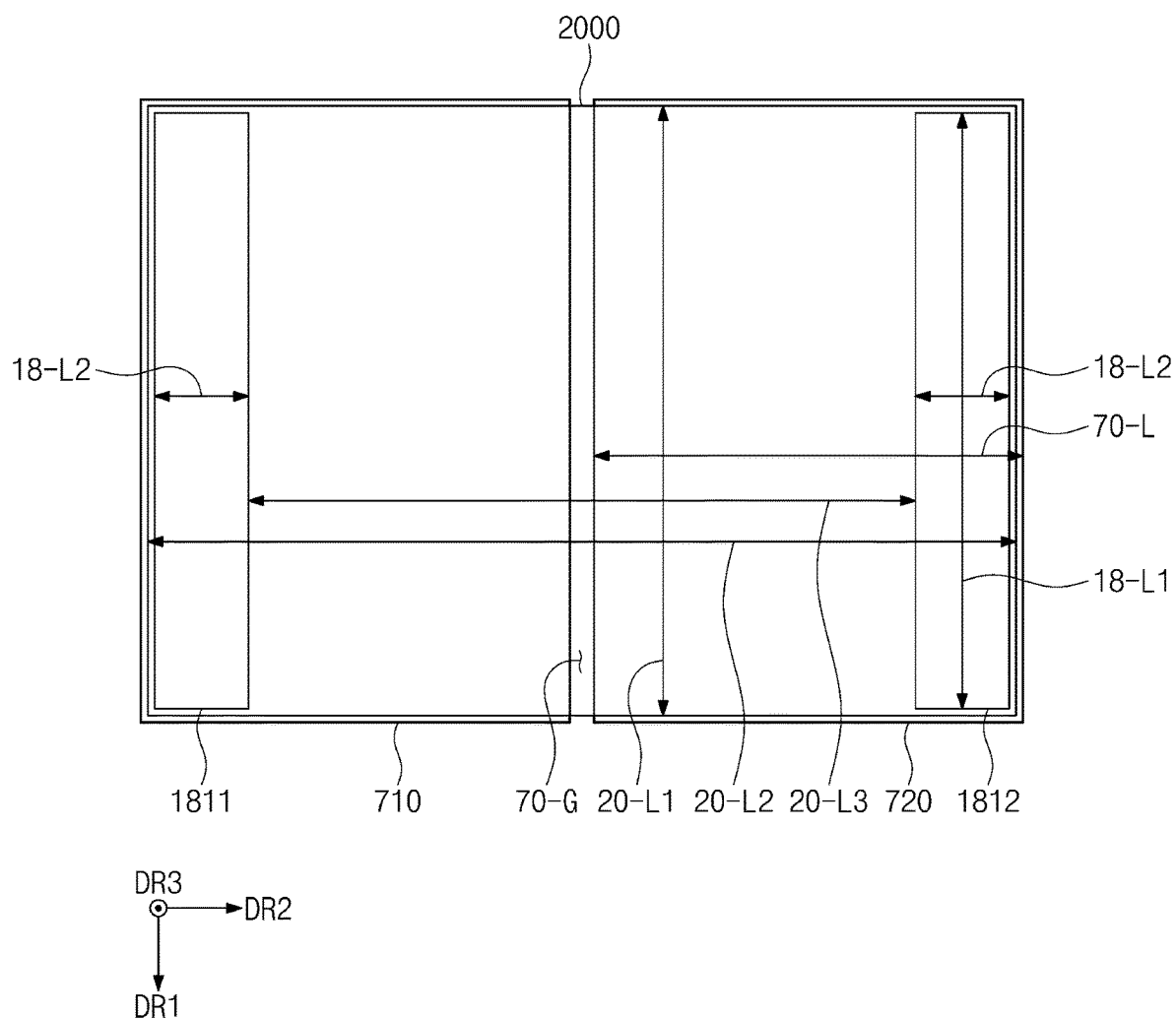
FIG. 6 is a plan view illustrating an embodiment of components of a display device.

FIG. 6 is a plan view illustrating an embodiment of a display device 1000. Among components described above, FIG. 6 illustrates only a first plate 710, a second plate 720, a cover film 2000, a first adhesive member 1811 and a second adhesive member 1812 for convenience of illustration.

Each of the first adhesive member 1811, the second adhesive member 1812, the cover film 2000, the first plate 710 and the second plate 720 may have a width along the second direction DR2 and a length along the first direction DR1. Referring to FIG. 6, each of the first adhesive member 1811 and the second adhesive member 1812 may have a bar shape lengthwise extending along a first direction DR1. A length 18-L1 of each of the first adhesive member 1811 and the second adhesive member 1812 along the first direction DR1 may be substantially the same as a length 20-L1 of the cover film 2000 along the first direction DR1.

A width 18-L2 of each of the first adhesive member 1811 and the second adhesive member 1812 along a second direction DR2 may be smaller than a width 70-L of each of the first plate 710 and the second plate 720 along the second direction DR2. In an embodiment, for example, the width 18-L2 of each of the first adhesive member 1811 and the second adhesive member 1812 may be about 5 mm. However, the width 18-L2 of each of the first adhesive member 1811 and the second adhesive member 1812 is not limited to the above-described example, and may be variously modified according to product design.

A first width 20-L2 is defined as a total width of the cover film 2000 along the second direction DR2, and a second width 20-L3 is defined as a total width of a portion of the cover film 2000 to which the first adhesive member 1811 and the second adhesive member 1812 are unattached (e.g., unattached width). The display device 1000 which is deformed (see FIGS. 3A to 3C), the second width 20-L3 may be modified.

In an embodiment, for example, the first width 20-L2 as a total width of the cover film 2000 may be about 110 mm, and the width 18-L2 of each of the first adhesive member 1811 and the second adhesive member 1812 may be about 5 mm. In this case, the second width 20-L3 as a total width of a portion of the cover film 2000 to which the first adhesive member 1811 and the second adhesive member 1812 are unattached may be about 100 mm.

The display device 1000 which is unfolded may define a width (e.g., original width) of a gap 70-G along the second direction DR2 between side surfaces of the first plate 710 and the second plate 720 of about 750 micrometers (µm). The display device 1000 (see FIG. 3C) which is folded, may define the distance 70-D (see FIG. 3C) between one end of the first plate 710 and one end of the second plate 720 may be larger than the gap width of the gap 70-G.

The display device 1000 which is folded has a radius of curvature. In an embodiment, for example, when a radius of curvature of the display device 1000 which is folded is about 2 mm, the distance 70-D may increase to 4000 μm as compared to the original width.

The display device 1000 which is unfolded and which is folded, defines second widths which are different from each other. A difference between the second width 20-L3 in the display device 1000 which is unfolded and the second width 20-L3 in the display device 1000 which is folded may be about 3.25 mm.

The cover film 2000 has a change rate corresponding to an elongation property thereof. A change rate of a value of the second width 20-L3 from the display device 1000 which is unfolded to the display device 1000 which is folded may be about 103.25%. The cover film 2000 may be elongated along the second direction DR2, corresponding to the described-above change rate.

Although not shown, the third adhesive member 1813 (see FIG. 3A) may have a shape corresponding to that of the first adhesive member 1811, and the fourth adhesive member 1814 (see FIG. 3A) may have a shape corresponding to that of the second adhesive member 1812.

Figure 7:
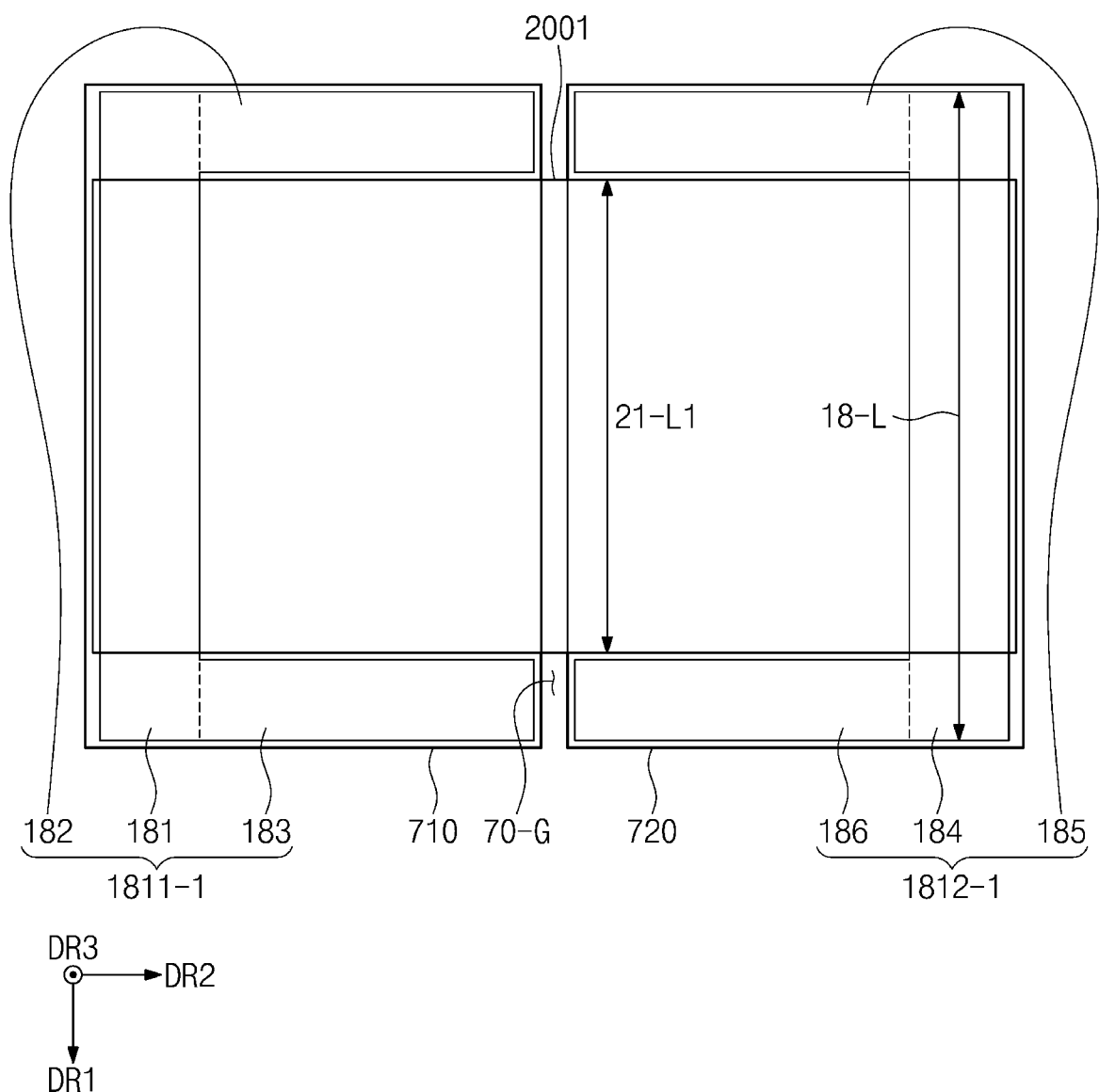
FIG. 7 is a plan view illustrating an embodiment of components of a display device.

FIG. 7 is a plan view illustrating an embodiment of a display device 1000. Among components described above, FIG. 7 illustrates only a first plate 710, a second plate 720, a cover film 2001, a first adhesive member 1811-1 and a second adhesive member 1812-1 for convenience of illustration.

Referring to FIG. 7, the first adhesive member 1811-1 may include a first adhesive area 181, a second adhesive area 182 and a third adhesive area 183. The second adhesive member 1812-1 may include a fourth adhesive area 184, a fifth adhesive area 185 and a sixth adhesive area 186.

Each of the first adhesive area 181 and the fourth adhesive area 184 may extend along a first direction DR1. A length 18-L of each of the first adhesive area 181 and the fourth adhesive area 184 along the first direction DR1 may correspond to the maximum length of each of the first adhesive member 1811-1 and the second adhesive member 1812-1 along the direction DR1.

The second adhesive area 182 may extend from a first end of the first adhesive area 181 along a second direction DR2, and the third adhesive area 183 may extend from a second end of the first adhesive area 181 along the second direction DR2. The fifth adhesive area 185 may extend from a first end of the fourth adhesive area 184 along the second direction DR2, and the sixth adhesive area 186 may extend from a second end of the fourth adhesive area 184 along the second direction DR2. The second adhesive area 182, the third adhesive area 183, the fifth adhesive area 185 and the sixth adhesive area 186 may be disposed between the first adhesive area 181 and the fourth adhesive area 184 along the second direction DR2.

A length 21-L1 of the cover film 2001 along the first direction DR1 may be less than the length 18-L of each of the first adhesive area 181 and the fourth adhesive area 184 along the first direction DR1. The cover film 2001 may be attached only to the first adhesive area 181 and the fourth adhesive area 184, and may not be attached to the second adhesive area 182, the third adhesive area 183, the fifth adhesive area 185 and the sixth adhesive area 186. In a plan view, along the first direction DR1, the cover film 2001 may be disposed between the second adhesive area 182 and the third adhesive area 183 and between the fifth adhesive area 185 and the sixth adhesive area 186.

Although not shown, the third adhesive member 1813 (see FIG. 3A) may have a shape corresponding to that of the first adhesive member 1811-1, and the fourth adhesive member 1814 (see FIG. 3A) may have a shape corresponding to that of the second adhesive member 1812-1. In an embodiment, for example, the second adhesive area 182 and the third adhesive area 183 may be in contact with the third adhesive member 1813 (see FIG. 3A), and the fifth adhesive area 185 and the sixth adhesive area 186 may be in contact with the fourth adhesive member 1814 (see FIG. 3A), since the cover film 2001 does not correspond to the second adhesive area 182, the third adhesive area 183, the fifth adhesive area 185 and the sixth adhesive area 186.

According to the embodiments, in the cover film 2000 that covers the region between the first plate 710 and the second plate 720, the film having the scratch resistant properties may be separately disposed at the portion of the cover film 2000 which comes into contact with the edges of the first plate 710 and the second plate 720. That is, the display module 100 which is folded disposes the second film 2200 between the first film 2100 and the first plate 710 and between the first film 2100 and the second plate 720. Accordingly, the damage of the cover film 2000 due to the folding and unfolding of the display device 1000 may be reduced or effectively prevented since inflow of foreign particles to between the first plate 710 and the second plate 720 are reduced or effectively prevented. As a result, the reliability of the display device 1000 may be improved.

Although described with reference to the embodiments of the present disclosure, it will be understood that various changes and modifications of the embodiments may be made by one skilled in the art or one having ordinary knowledge in the art without departing from the spirit and technical field of the invention as hereinafter claimed. Hence, the technical scope of the invention is not limited to the detailed descriptions in the specification, but it should be determined only by reference of the claims.

What is claimed is:
1. A display device comprising:
a display module which displays an image and is foldable, the display module comprising a first non-folding area, a folding area at which the display module is foldable, and a second non-folding area, in order;
a first plate corresponding to the first non-folding area of the display module;
a second plate corresponding to the second non-folding area of the display module and spaced apart from the first plate; and
a cover film facing the display module with both the first plate and the second plate therebetween, the cover film comprising:
a first film corresponding to each of the first non-folding area, the folding area and the second non-folding area, the first film attached to each of the first plate and the second plate; and
at the folding area, a second film attached to the first film,
wherein the display module which is folded disposes the second film between the first film and the first plate and between the first film and the second plate,
each of the first plate and the second plate comprises a bottom surface which is closest to the first film of the cover film,
the first film of the cover film comprises:

a first attachment area at which the first film is attached to the first plate at the bottom surface of the first plate;

a second attachment area at which the first film is attached to the second plate at the bottom surface of the second plate; and a connection area which connects the first attachment area to the second attachment area, and within the cover film, the second film is attached to the connection area of the first film.

2. The display device of claim 1, wherein within the cover film, the connection area of the first film comprises:

a central area at which the second film is attached to the first film; and a peripheral area which is adjacent to the central area.

3. The display device of claim 2, wherein in a direction along the display module, within the cover film, the central area and the connection area of the first film each has a width, and the width of the central area is about 10% to about 40% of the width of the connection area.

4. The display device of claim 1, further comprising:

a first adhesive layer between the cover film and the first plate; and a second adhesive layer between the cover film and the second plate.

5. The display device of claim 4, further comprising:

a component layer which includes a camera module, a main board, a battery or a housing and faces the first plate and the second plate, with the cover film therebetween;

a third adhesive layer between the component layer and the cover film and corresponding to the first adhesive layer; and a fourth adhesive layer between the component layer and the cover film and corresponding to the second adhesive layer.

6. The display device of claim 4, wherein the first non-folding area, the folding area and the second non-folding area are in order along a first direction, the display module which is unfolded is parallel to a plane defined by the first direction and a second direction which crosses the first direction, the first adhesive layer has a bar shape extending along the second direction, and the second adhesive layer has a bar shape extending in the second direction.

7. The display device of claim 6, wherein along the second direction, each of the first adhesive layer, the second adhesive layer and the cover film has a length, and the length of the first adhesive layer and the length of the second adhesive layer is the same as the length of the cover film.

8. The display device of claim 1, wherein the cover film further comprises a film adhesive layer which is between the first film and the second film and attaches the first film to the second film.

9. The display device of claim 1, wherein the display module which is unfolded defines a gap between the first plate and the second plate which is spaced apart from the first plate, and the second film of the cover film corresponds to the gap.

10. The display device of claim 9, wherein at the gap, the first plate has a side surface and the second plate has a side surface which is spaced apart from and faces the side surface of the first plate, the side surface of the first plate includes an anti-friction layer, the side surface of the second plate includes an anti-friction layer, and the display module which is folded disposes the second film of the cover film in contact with both the side surface of the first plate and the side surface of the second plate.

11. The display device of claim 9, wherein at the gap, the first plate has a side surface and the second plate has a side surface which is spaced apart from and faces the side surface of the first plate, the side surface of the first plate and the side surface of the second plate each has a convexly rounded shape towards the gap, and the display module which is folded dispose the second film of the cover film in contact with both the side surface of the first plate which has the convexly rounded shape and the side surface of the second plate which has the convexly rounded shape.

12. The display device of claim 9, wherein at the gap, the first plate has a side surface and the second plate has a side surface which is spaced apart from and faces the side surface of the first plate, within the cover film:

each of the first film and the second film has a friction coefficient and a hardness, and the friction coefficient of the second film is lower than the friction coefficient of the first film, and the hardness of the second film is higher than the hardness of the first film, and the display module which is folded dispose the second film of the cover film in contact with both the side surface of the first plate and the side surface of the second plate.

13. The display device of claim 1, wherein the display module which is unfolded is flat, and the display module which is folded disposes the first non-folding area and the second non-folding area facing each other.

14. The display device of claim 13, wherein the first non-folding area, the folding area and the second non-folding area are in order along a first direction, the display module further comprises a folding axis about which the display module is foldable, the first plate comprises a bottom surface which is closest to the first film of the cover film, the display module which is folded defines a minimum distance between the folding axis and the bottom surface of the first plate, and the second film has a width along the first direction which satisfies Equation 1:

$$2*R < L2 \leq 2*(R+20 \text{ mm}) \qquad [\text{Equation 1}]$$

where L2 is the width of the second film and R is the minimum distance between the folding axis and the bottom surface of the first plate.

15. The display device of claim 1, wherein the cover film is flexible.

16. The display device of claim 1, wherein the first film comprises polyurethane resin, and the second film comprises polyethylene terephthalate, polyetheretherketone or polyimide.

17. The display device of claim 1, wherein the first film of the cover film comprises:

a top surface which is closest to both the first plate and the second plate; and a bottom surface which is opposite to the top surface, and within the cover film, the second film is attached to the top surface of the first film.

18. A display device comprising:

a display module which displays an image and is foldable, the display module comprising a folding area at which the display module is foldable;

a first plate and a second plate adjacent to and spaced apart from each other along the display module;

at the folding area, a gap between the first plate and the second plate which are spaced apart from each other;

at the gap, the first plate has a side surface and the second plate has a side surface which is spaced apart from and faces the side surface of the first plate; and a cover film facing the display module with both the first plate and the second plate therebetween, the cover film comprising:

a first film attached to each of the first plate and the second plate; and at the folding area, a second film attached to the first film and covering the gap which is between the first plate and the second plate, wherein the display module which is folded disposes the second film of the cover film in contact with both the side surface of the first plate and the side surface of the second plate, each of the first plate and the second plate comprises a bottom surface which is closest to the first film of the cover film, the first film of the cover film comprises:

a first attachment area at which the first film is attached to the first plate at the bottom surface of the first plate;

a second attachment area at which the first film is attached to the second plate at the bottom surface of the second plate; and a connection area which connects the first attachment area to the second attachment area, and within the cover film, the second film is attached to the connection area of the first film.

\* \* \* \* \*